United States Patent
Jang et al.

(10) Patent No.: US 11,245,271 B2
(45) Date of Patent: Feb. 8, 2022

(54) APPARATUS FOR CONTROLLING BATTERIES AND ELECTRONIC DEVICE INCLUDING BATTERIES

(71) Applicant: SAMSUNG ELECTRO-MECHANICS CO., LTD., Suwon-si (KR)

(72) Inventors: Jung Min Jang, Suwon-si (KR); Sang Yun Lee, Suwon-si (KR); Jung Won Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 124 days.

(21) Appl. No.: 16/812,778

(22) Filed: Mar. 9, 2020

(65) Prior Publication Data

US 2020/0412154 A1 Dec. 31, 2020

(30) Foreign Application Priority Data

Jun. 28, 2019 (KR) .................. 10-2019-0078186
Aug. 16, 2019 (KR) .................. 10-2019-0100499

(51) Int. Cl.
| | | |
|---|---|---|
| *H01M 10/44* | (2006.01) | |
| *H01M 10/46* | (2006.01) | |
| *H02J 7/00* | (2006.01) | |
| *H01M 10/48* | (2006.01) | |
| *H01M 10/42* | (2006.01) | |
| *G01R 19/00* | (2006.01) | |

(52) U.S. Cl.
CPC ...... *H02J 7/00304* (2020.01); *G01R 19/0092* (2013.01); *H01M 10/4214* (2013.01); *H01M 10/44* (2013.01); *H01M 10/48* (2013.01); *H02J 7/0016* (2013.01); *H02J 7/0063* (2013.01); *H02J 7/00718* (2020.01); *H02J 2207/20* (2020.01)

(58) Field of Classification Search
CPC .. H02J 7/00304; H02J 7/00718; H02J 7/0016; H02J 7/0047; H02J 7/342; H01M 10/48; H01M 10/4214; H01M 10/46; H01M 10/4207
USPC ........ 320/103, 107, 116, 118, 119, 132, 148, 320/156, 162, 138
See application file for complete search history.

(56) References Cited

U.S. PATENT DOCUMENTS 6,005,368 A * 12/1999 Frame .................. G06F 1/263
 320/113

FOREIGN PATENT DOCUMENTS

| JP | 2008-4379 A | 1/2008 |
|---|---|---|
| JP | 2013-178994 A | 9/2013 |

* cited by examiner

*Primary Examiner* — Edward Tso
(74) *Attorney, Agent, or Firm* — Morgan, Lewis & Bockius LLP

(57) ABSTRACT

An apparatus for controlling batteries includes a first current sensor configured to sense a first current flowing from a first battery to an output unit, a first current limiter configured to use a sensing result of the first current sensor to limit an increase of the first current when the first current exceeds a reference current, and a second current activator configured to draw a second current of a second battery to the output unit based on the limiting of the first current limiter.

27 Claims, 13 Drawing Sheets

APPARATUS FOR CONTROLLING BATTERIES AND ELECTRONIC DEVICE INCLUDING BATTERIES

CROSS-REFERENCE TO RELATED APPLICATION(S)

This application claims benefit of priority to Korean Patent Application No. 10-2019-0078186 filed on Jun. 28, 2019, and Korean Patent Application No. 10-2019-0100499 filed on Aug. 16, 2019 in the Korean Intellectual Property Office, the disclosures of which are incorporated herein by reference in their entireties.

BACKGROUND

1. Field

The present disclosure relates to an apparatus for controlling batteries, and an electronic device including batteries.

2. Description of Related Art

In recent years, with the spread of electronic devices such as computers, mobile phone terminals, or the like, batteries, which are power sources, have been required to be further downsized and to have relatively high capacity. At present, a lithium ion secondary battery capable of having relatively high energy density, having relatively small size, and being relatively lightweight has been put to practical use, and demand for portable power sources has increased. However, depending on the type of electronic equipment used, such a lithium ion secondary battery has not yet reached the end of guaranteeing sufficient continuous use time.

For example, electronic devices may require varying amounts of current or relatively high current to provide a variety of functions, but the lifespan of the battery may be reduced by providing such various or relatively high current.

Since the lifespan of an electronic device such as a portable terminal is substantially determined by the lifespan of the battery, the reduction of the lifespan of the battery may be fatal for the electronic device.

SUMMARY

An aspect of the present disclosure is to provide an apparatus for controlling batteries, and an electronic device including batteries.

According to an aspect of the present disclosure, an apparatus for controlling batteries includes a first current sensor configured to sense a first current flowing from a first battery to an output unit, a first current limiter configured to use a sensing result of the first current sensor to limit an increase of the first current when the first current exceeds a reference current, and a second current activator configured to draw a second current of a second battery to the output unit based on the limiting of the first current limiter.

According to another aspect of the present disclosure, an electronic device includes a substrate providing an arrangement space for a load, a first battery providing first electric power to the load and comprising a liquid electrolyte, a second battery mounted on the substrate and comprising a solid electrolyte, and a battery controller configured to cut off second electric power supplied from the second battery to the load when an input current of the load is equal to or lower than a reference current, and activate supply of the second electric power to the load when the input current of the load exceeds the reference current.

According to another aspect of the present disclosure, a power controller includes a sensor configured to sense a first electric power supplied from a first power source to a load, and an output limiter configured to limit increase of the first electric power supplied from the first source based on the first electric power supplied from the first source exceeding a reference threshold. A switch is configured to allow flow of a second electric power supplied from a second power source to the load based on the output limiter limiting the increase of the first electric power supplied from the first power source.

According to a further aspect of the present disclosure, a power controller for controlling flow of power from a first power source to an output unit includes a first current limiter, a second power source, and a second current activator. The first current limiter is configured to be disposed in series with the first power source between a ground terminal and the output unit, and configured to regulate power flow from the first power source to the output unit. The second power source and the second current activator are disposed in series with each other between the ground terminal and the output unit, and the second current activator regulates power flow from the second power source to the output unit under control of the first current limiter.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1A:
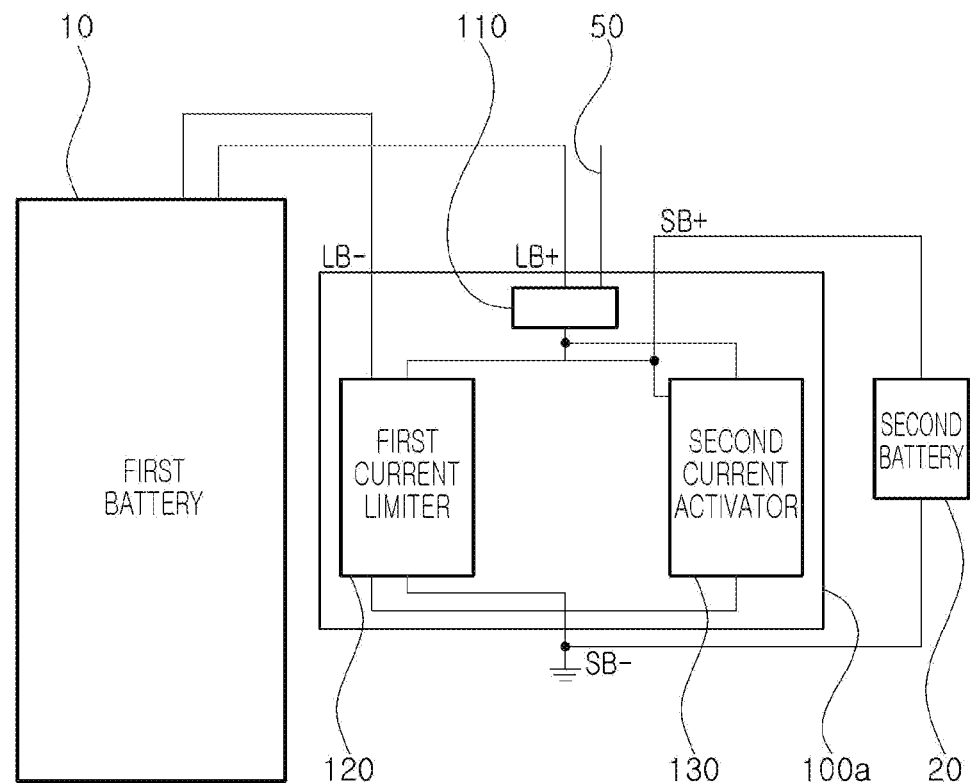
FIG. 1A is a view illustrating an apparatus for controlling batteries according to an example embodiment of the present disclosure.

The following detailed description of the present disclosure refers to the accompanying drawings that show, byway of illustration, specific embodiments in which the present disclosure is practiced. These embodiments may be described in sufficient detail to enable those skilled in the art to practice the present disclosure. It can be understood that the various embodiments of the present disclosure are different but need not be mutually exclusive. For example, certain shapes, structures, and characteristics described in one embodiment may be embodied in other embodiments without departing from the spirit and scope of the present disclosure with respect to the one embodiment. In addition, it can be understood that the location or arrangement of individual components within each disclosed embodiment may be changed without departing from the spirit and scope of the present disclosure. The following detailed description is, therefore, not to be taken in a limiting sense, and the scope of the present disclosure may be defined only by the appended claims, along with the full scope of equivalents to which such claims may be entitled. Like reference numerals in the drawings refer to the same or similar functions or elements throughout the several aspects.

Hereinafter, example embodiments of the present disclosure will be described in detail with reference to the accompanying drawings such that those skilled in the art may easily implement the present disclosure.

Figure 2A:
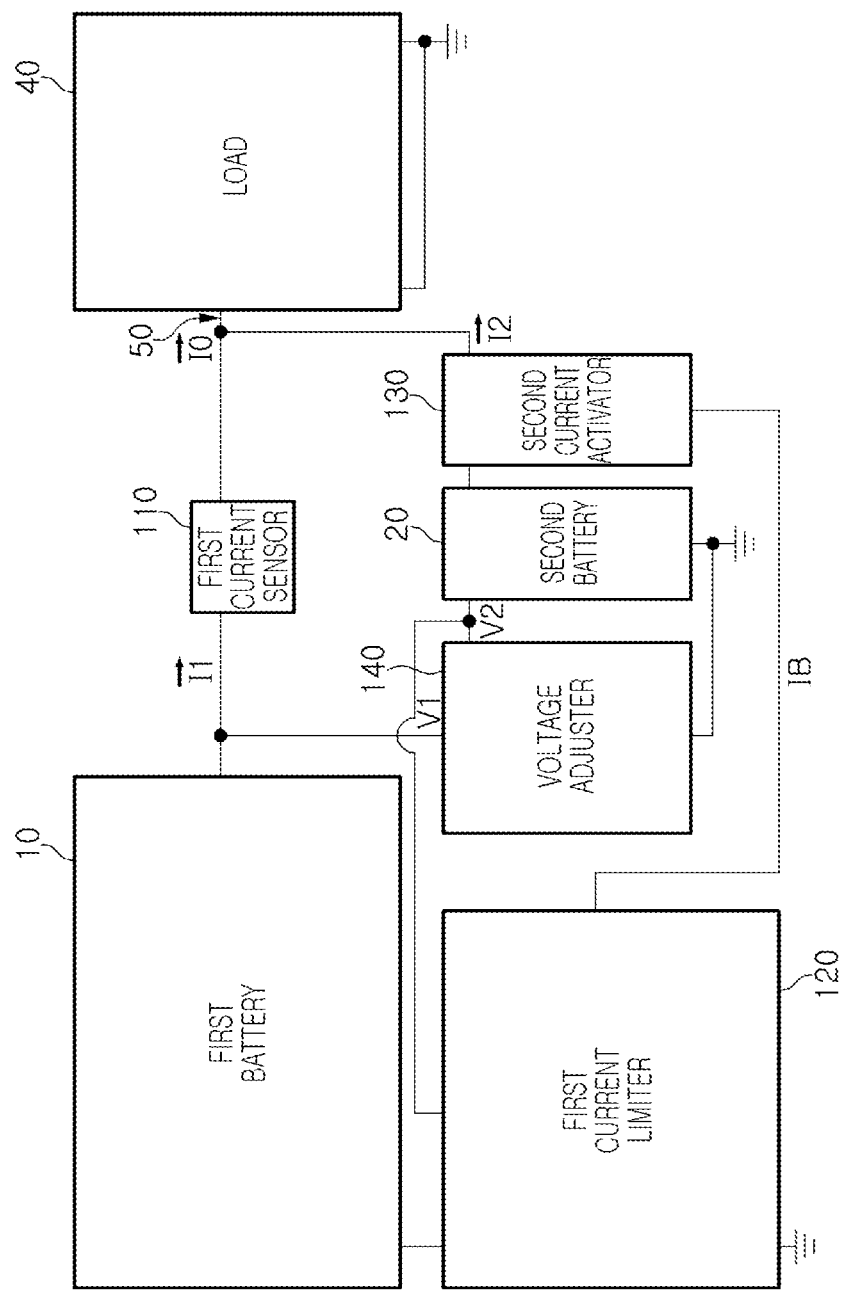
FIG. 2A is a view illustrating a connection relationship between components of an apparatus for controlling batteries according to an example embodiment of the present disclosure.

FIG. 1A is a view illustrating an apparatus for controlling batteries according to an example embodiment of the present disclosure, and FIG. 2A is a view illustrating a connection relationship between components of an apparatus for controlling batteries according to an example embodiment of the present disclosure.

Referring to FIGS. 1A and 2A, an apparatus for controlling batteries 100a according to an example embodiment of the present disclosure may control sizes of first and second currents (I1 and I2) according to an output current (IO) flowing from an output unit 50 to a load 40. In this case, the output current (IO) may correspond to the sum of first current (I1) of a first battery 10 and second current (I2) of a second battery 20.

The apparatus for controlling batteries 100a may control the first and second currents (I1 and I2) through control of the first battery 10 and the second battery 20.

The first battery 10 and the second battery 20 may have different characteristics (e.g., rated voltage, rated capacity, electrical stability, physical/chemical durability, size, etc.).

For example, the first battery 10 may increase the size of the first current (I1) relatively easily, and may be configured to stably provide the first current (I1) to the load 40 as it has a high capacity.

For example, the first battery 10 may be configured to include a liquid electrolyte, and may have a relatively high energy density or be manufactured relatively inexpensively on an energy unit basis, as compared to the second battery 20. Therefore, the first battery 10 may relatively easily supply the load 40 with the first current (I1) higher than the second current (I2) of the second battery 20.

For example, the second battery 20 may flexibly provide the second current (I2), which may be a relatively low current, to the load 40, and may be miniaturized with high stability/durability relatively easily.

For example, the second battery 20 may be configured to include a solid electrolyte, may have characteristics that may be relatively resistant to temperature changes and external shocks, relative to the first battery 10, and may deal with the change of the second current (I2) supplied to the load 40 more efficiently, based on a stable state of the solid electrolyte.

The apparatus for controlling batteries 100a may control the first battery 10 and the second battery 20 having different characteristics in different principles and/or manners, to efficiently combine the first and second currents having different characteristics to provide the output current (IC)).

Referring to FIGS. 1A and 2A, a first current sensor 110, a first current limiter 120, and a second current activator 130 may be included.

For example, the first current sensor 110, the first current limiter 120, and the second current activator 130 may be configured as a single integrated circuit (IC), may be configured in the form of a single IC together with a power management circuit, or may be composed of a plurality of ICs.

The first current sensor 110 may be configured to sense the first current (I1) flowing from the first battery 10 to the output unit 50.

The first current limiter 120 may be configured to limit an increase in the first current (I1) by using sensing results of the first current sensor 110, when the first current (I1) exceeds a reference current (e.g., 3A).

The second current activator 130 may be configured to draw the second current (I2) of the second battery 20 to the output unit 50, based on the limit operation of the first current limiter 120.

For example, when a magnitude of the output current (IO) is equal to or lower than a reference current, the apparatus for controlling batteries 100a may substantially control the first and second batteries 10 and 20 such that only the first battery 10 supplies the first current (I1) to the load 40.

For example, when a magnitude of the output current (IO) is greater than a reference current, the apparatus for controlling batteries 100a may control the first battery 10 and the second battery 20, to allow the first battery 10 to supply the load 40 with the first current (I1) having the same magnitude as that of the reference current, and to allow the second battery 20 to supply the load 40 with the second current (I2) corresponding to the rest of the output current (IO) except for the first current (I1).

Therefore, since the apparatus for controlling batteries 100a may limit the size of the first current (I1) from becoming too high, the apparatus for controlling batteries 100a may easily extend the lifespan of the first battery 10, may reduce the size of the first battery 10 more easily according to the relaxation of the specifications (e.g., maximum current, rated capacity) required for the batteries, and may further improve the safety of the first battery 10 (e.g., explosion potential in high temperature environments).

In addition, the apparatus for controlling batteries 100a may provide the load 40 with a relatively high output current (IO) regardless of the maximum current and/or rated capacity of the second battery 20.

In addition, since the load 40 may be flexibly provided with a wide range of output current (IO) without substantially inducing a shortening of the lifespan of the first battery 10, it is possible to efficiently perform various circuit operations or deal efficiently with various energy demands. For example, the load 40 may be smoothly provided with a relatively high output current (IO) to prevent distortion of the signal used (e.g., rising/falling speed limits, rising/falling saturation, etc. of the pulse waveform).

Figure 1B:
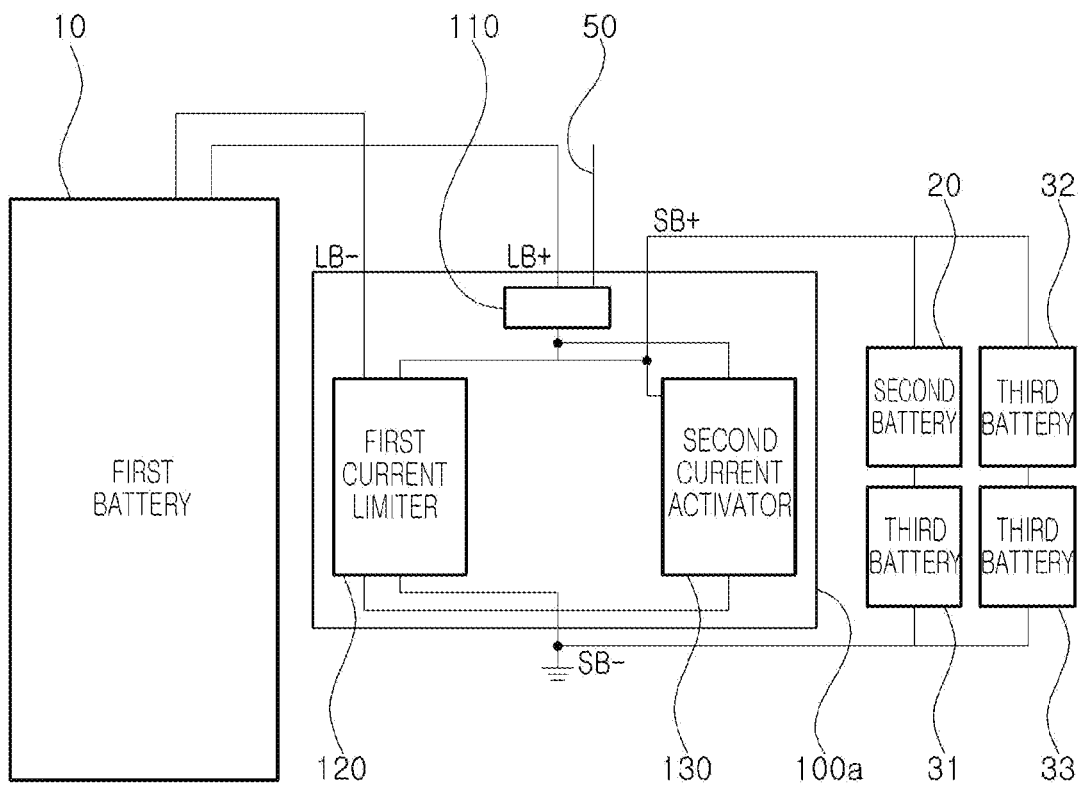
FIG. 1B is a view illustrating a structure in which the number of batteries is greater than that of the apparatus for controlling batteries illustrated in FIG. 1A.

FIG. 1B is a view illustrating a structure in which the number of batteries is greater than that of the apparatus for controlling batteries illustrated in FIG. 1A.

Referring to FIG. 1B, the apparatus for controlling batteries according to an example embodiment may further control third batteries 31, 32, and 33.

The second current activator 130 may be configured to draw a third current of the third batteries 31, 32, and 33 electrically connected to the second battery 20 to the output unit 50, based on the limit operation of the first current limiter 120.

When the third batteries 31, 32, and 33 are connected to the second battery 20 in parallel, a magnitude of the output current provided to the load may be greater, even without substantially increasing the first current of the first battery 10.

When the third batteries 31, 32, and 33 are connected to the second battery 20 in series, the total voltages of the second battery 20 and the third batteries 31, 32, and 33 may be higher than a second voltage of the second battery 20.

Therefore, when a first voltage of the first battery 10 is relatively high, the total voltages of the second battery 20 and the third batteries 31, 32, and 33 may be more easily matched to the first voltage.

Figure 1C:
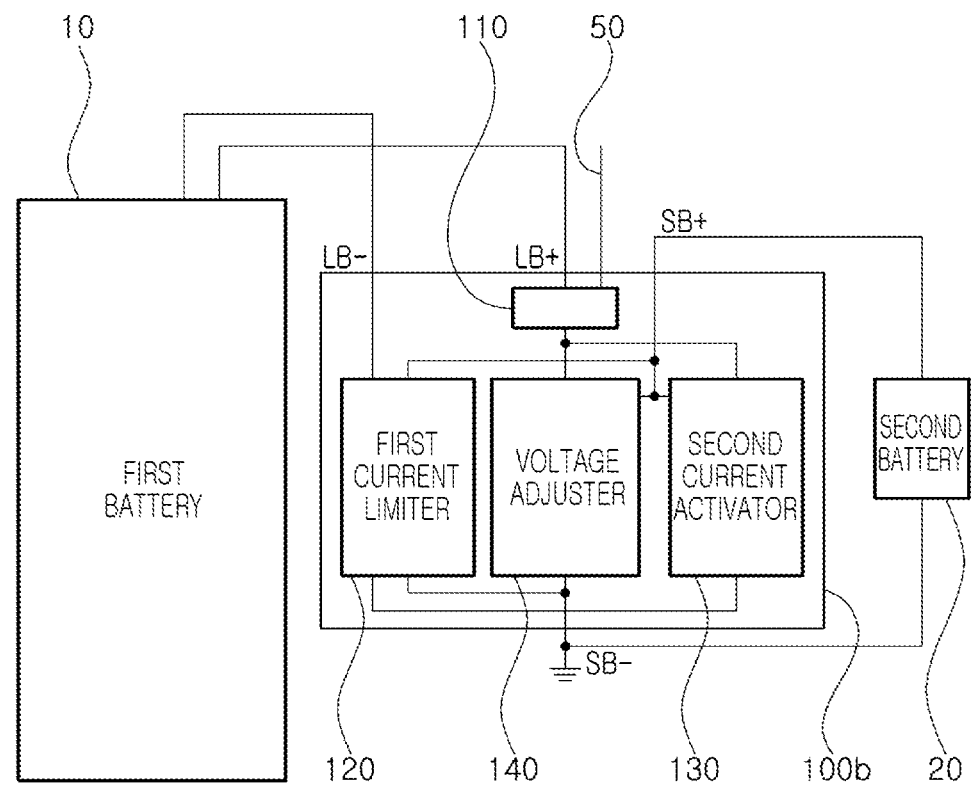
FIG. 1C is a view illustrating a structure in which a voltage adjuster is added to the apparatus for controlling batteries illustrated in FIG. 1A.

FIG. 1C is a view illustrating a structure in which a voltage adjuster is added to the apparatus for controlling batteries illustrated in FIG. 1A.

Referring to FIG. 1C, the apparatus for controlling batteries according to an example embodiment may further include a voltage adjuster 140.

The voltage adjuster 140 may be configured to adjust the second voltage such that the second voltage of the second battery 20 is closer to the first voltage of the first battery 10.

For example, the voltage adjuster 140 may be implemented as a boost DC-DC converter circuit or a charge pump circuit, and may support charge/discharge between the first battery 10 and the second battery 20.

As the second voltage of the second battery 20 is closer to the first voltage of the first battery 10, a rate of change in a voltage of the load according to a change in magnitude of the second current of the second battery 20 may be smaller. Therefore, the load may stably receive a relatively high output current from the first and second batteries 10 and 20, and may prevent operation of a low voltage protection circuit or the like that may be linked to the load.

Figure 1D:
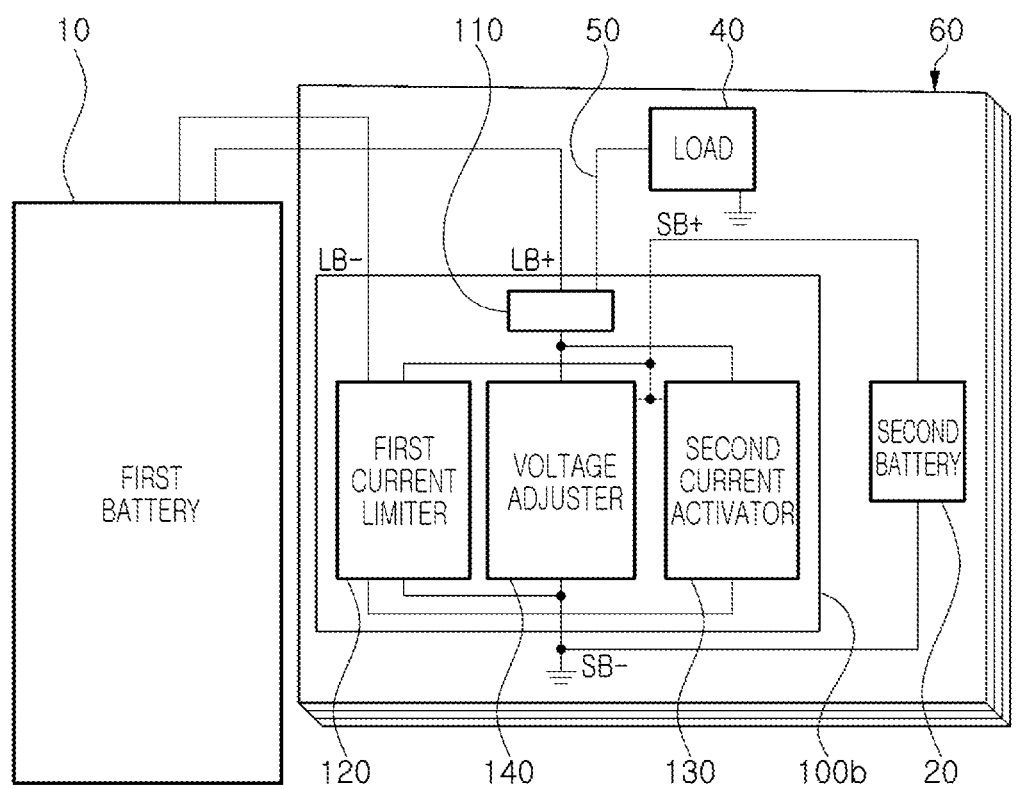
FIG. 1D is a view illustrating an electronic device including batteries, according to an embodiment of the present disclosure.

FIG. 1D is a view illustrating an electronic device including batteries, according to an embodiment of the present disclosure.

Referring to FIG. 1D, an electronic device including batteries according to an embodiment of the present disclosure may include a substrate 60, a first battery 10, a second battery 20, and a battery controller 100b.

For example, a type of electronic device according to an embodiment of the present disclosure may include a smartphone, a personal digital assistant, a digital video camera, a digital still camera, a network system, a computer, a monitor, a tablet, a laptop, a netbook, a television, a video game, a smart watch, an automotive, etc., but is not limited thereto.

The substrate 60 may provide an arrangement space of a load 40.

For example, the substrate 60 may have a structure in which wirings and insulating layers are alternately stacked, such as a printed circuit board (PCB), and may have a first wiring electrically connecting the load 40 and the battery controller 100b, and a second wiring electrically connecting the second battery 20 and the battery controller 100b.

For example, the load 40 may be a portion or peripheral component of a central processing unit (CPU) or an application processor, and may generate digital and/or analog signals based on an output current supplied from the first battery 10 and/or the second battery 20, or information may be processed/output based on the signals. For example, the signal and/or information may be transferred to a communications modem, a high frequency circuit, or the like to be used for communication, or may be transferred to a display device or an image processing unit to be used for display.

For example, the load 40 may adjust the output current of the battery controller 100b through a power management integrated circuit (PMIC), but is not limited thereto.

The first battery 10 may provide first electric power to the load 40, and may include a liquid electrolyte.

The second battery 20 may be mounted on the substrate 60, and may include a solid electrolyte.

The battery controller 100b may correspond to an apparatus for controlling batteries according to an embodiment of the present disclosure. The battery controller 100b may be configured to cut off second electric power provided from the second battery 20 to the load 40, when an input current of the load 40 is lower than or equal to a reference current. The battery controller 100b may be configured to activate the supply of the second electric power to the load 40, when an input current of the load 40 exceeds a reference current.

Therefore, since the load 40 may be flexibly provided with a wide range of output currents without substantially inducing a shortening of the lifespan of the first battery 10, it is possible to efficiently perform various circuit operations or deal efficiently with various energy demands. For example, the load 40 may be smoothly provided with a relatively high output current to prevent distortion of the signal used (e.g., rising/falling speed limits, rising/falling saturation, etc. of the pulse waveform).

For example, the electronic device including batteries according to an embodiment of the present disclosure may improve the substantial performance of the load 40, even without substantially shortening the lifespan of the first battery 10, to ensure performance of applications (e.g., communication, display, big data management, etc.), and may improve the stability and durability of the first and second batteries 10 and 20 to have improved stability and durability of the electronic device.

Referring to FIGS. 1A to 1D, the apparatus for controlling batteries 100a and/or the battery controller 100b according to an embodiment of the present disclosure may include a first positive electrode connecting portion LB+, a first negative electrode connecting portion LB−, a second positive electrode connecting portion SB+, and a second negative electrode connecting portion SB−.

The first positive electrode connecting portion LB+ may be configured to connect a positive electrode of the first battery 10.

The first negative electrode connecting portion LB− may be configured to connect a negative electrode of the first battery 10.

The second positive electrode connecting portion SB+ may be configured to connect a positive electrode of the second battery 20.

The second negative electrode connecting portion SB− may be configured to connect a negative electrode of the second battery 20.

For example, the first battery 10 and the second battery 20 may be electrically connected to the apparatus for controlling batteries 100a and/or the battery controller 100b through different electrical paths.

Therefore, since the first battery 10 and the second battery 20 may be arranged in positions suitable for each other in the electronic device, a degree of freedom in which the first battery 10 and the second battery 20 in the electronic device are arranged may be improved.

For example, when the first battery 10 has a relatively large size, the first battery 10 may disposed to be separated from the substrate 60.

For example, when the battery controller 100b and the second battery 20 are electrically connected to the substrate 60, the second positive electrode connecting portion SB+ and the second negative electrode connecting portion SB− may be connected to the positive electrode and the negative electrode of the second battery 20 through a plurality of different wires of the substrate 60, respectively.

Figure 2B:
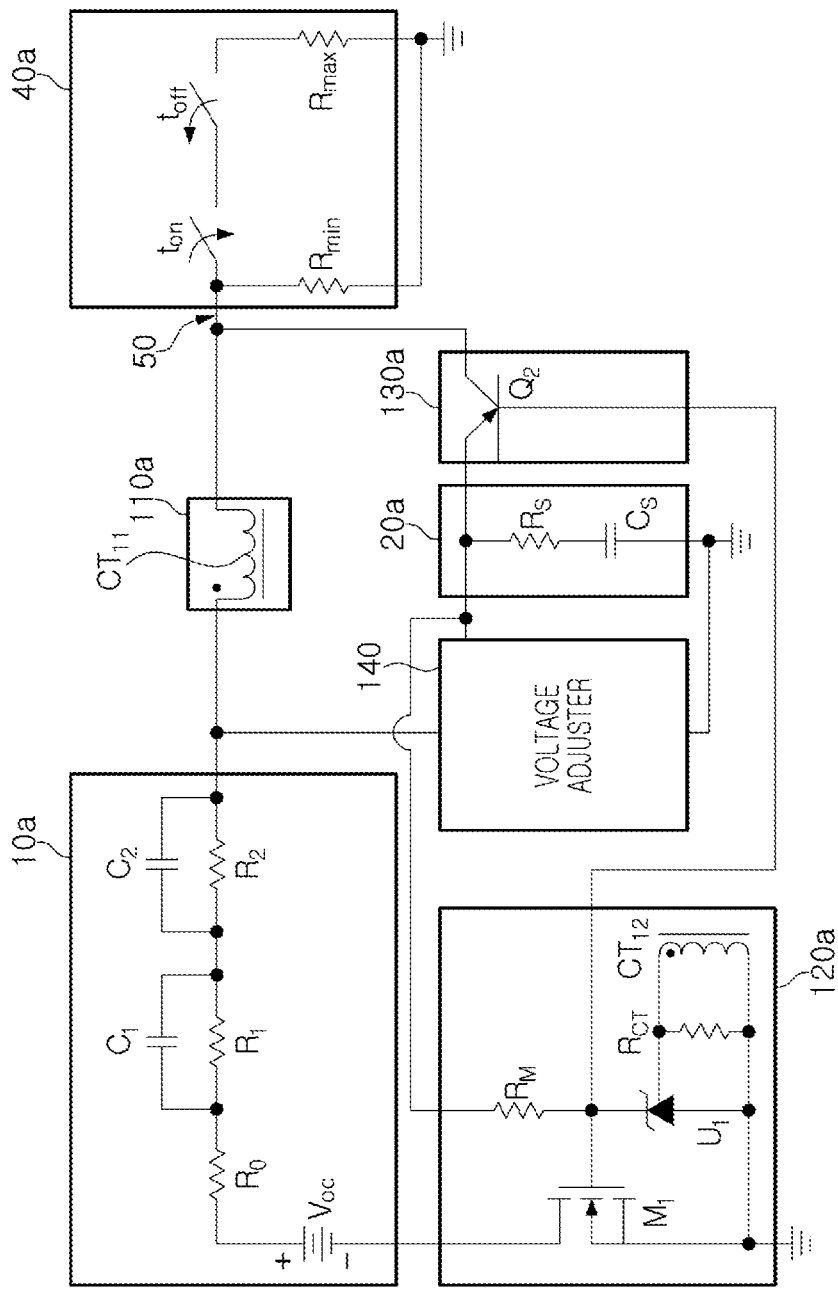
FIG. 2B is a circuit diagram illustrating an equivalent circuit of an apparatus for controlling batteries according to an embodiment of the present disclosure.

FIG. 2B is a circuit diagram illustrating an apparatus for controlling batteries according to an embodiment of the present disclosure.

Referring to FIG. 2B, an apparatus for controlling batteries according to an embodiment of the present disclosure may include a first current sensor 110a, a first current limiter 120a, and a second current activator 130a. A first battery 10a and a second battery 20a may be controlled according to an output current supplied to a load 40a.

The first battery 10a may be modeled by a combination of first and second capacitors $C_1$ and $C_2$, zero, first, and second resistors $R_0$, $R_1$, and $R_2$, and an open circuit voltage ($V_{oc}$).

The second battery 20a may be modeled by a combination of a third capacitor $C_s$ and a third resistor $R_s$.

The load 40a may be modeled by a combination of a maximum resistor $R_{max}$, a minimum resistor $R_{min}$, and switches $t_{on}$ and $t_{off}$, and may be connected to an output unit 50.

The first current sensor 110a may include a current transformer that generates a sensing current based on a first current. A primary side $CT_{11}$ of the current transformer may be electrically connected between the first battery 10a and the load 40a, and a secondary side $CT_{12}$ of the current transformer may be electrically connected to the first current limiter 120a.

The first current limiter 120a may include an impedance element $R_{CT}$ that provides a sensing voltage corresponding to the sensing current flowing in the secondary side $CT_{12}$ of the current transformer.

The first current limiter 120a may include a diode $U_1$ which may be in a breakdown state when the sensing voltage reaches a reference voltage corresponding to a reference current. For example, the diode $U_1$ may be a Zener diode.

When a reverse bias is applied to the diode $U_1$ and the sensing voltage does not reach the reference voltage, a current of the diode $U_1$ may be very lower.

When a reverse bias is applied to the diode $U_1$ and the sensing voltage reaches the reference voltage, a current of the diode $U_1$ may increase rapidly according to the breakdown state of the diode $U_1$.

In addition, when the diode $U_1$ is in the breakdown state, a rate of change in voltage according to a change in current of the diode $U_1$ may be very small.

The first current limiter 120a may include a current limiting transistor $M_1$ that receives a voltage of the diode $U_1$ through a gate terminal.

When the diode $U_1$ is in the breakdown state, the voltage of the diode $U_1$ may hardly change. Therefore, a current flowing between a drain terminal and a source terminal of the current limiting transistor $M_1$ may hardly change.

The current limiting transistor $M_1$ may use a path between the drain terminal and the source terminal as a path through which a current corresponding to the first current of the first battery 10a flows.

When the diode $U_1$ is in the breakdown state, a current flowing between the drain terminal and the source terminal of the current limiting transistor $M_1$ may hardly change. Therefore, an increase in the first current of the first battery 10a may be limited.

For example, the first current limiter 120a may be configured to limit an increase in the first current of the first battery 10a by using a breakdown voltage of the diode $U_1$.

The current of the diode $U_1$ may be transferred to the second current activator 130a through a driving resistor $R_M$.

The second current activator 130a may include a current activating transistor $Q_2$ that receives the current of the diode $U_1$ through a base terminal.

The current activating transistor $Q_2$ may use a path between an emitter terminal and a collector terminal as an electrical path between the second battery 20 and the output unit 50.

When the diode $U_1$ is not in the breakdown state, a base current of the base terminal of the current activating transistor $Q_2$ may be very small, and a current between the emitter terminal and the collector terminal of the current activating transistor $Q_2$ may also be relatively small. Therefore, the current activating transistor $Q_2$ may block the electrical path between the second battery 20 and the output unit 50.

When the diode $U_1$ is in the breakdown state, abase current of the base terminal of the current activating transistor $Q_2$ may be relatively high, and a current between the emitter terminal and the collector terminal of the current activating transistor $Q_2$ may also be relatively high. Therefore, the current activating transistor $Q_2$ may activate the electrical path between the second battery 20 and the output unit 50.

As a result, the second current activator 130a may transfer the second current of the second battery 20 to the output unit 50, based on a first current increase limit operation of the first current limiter 120a.

The current limiting transistor $M_1$ may be a field effect transistor, and the current activating transistor $Q_2$ may be a bipolar junction transistor BJT, but are not limited thereto. For example, the current activating transistor $Q_2$ may be composed of other types of transistors that operate based on the current of the base terminal.

Figure 2C:
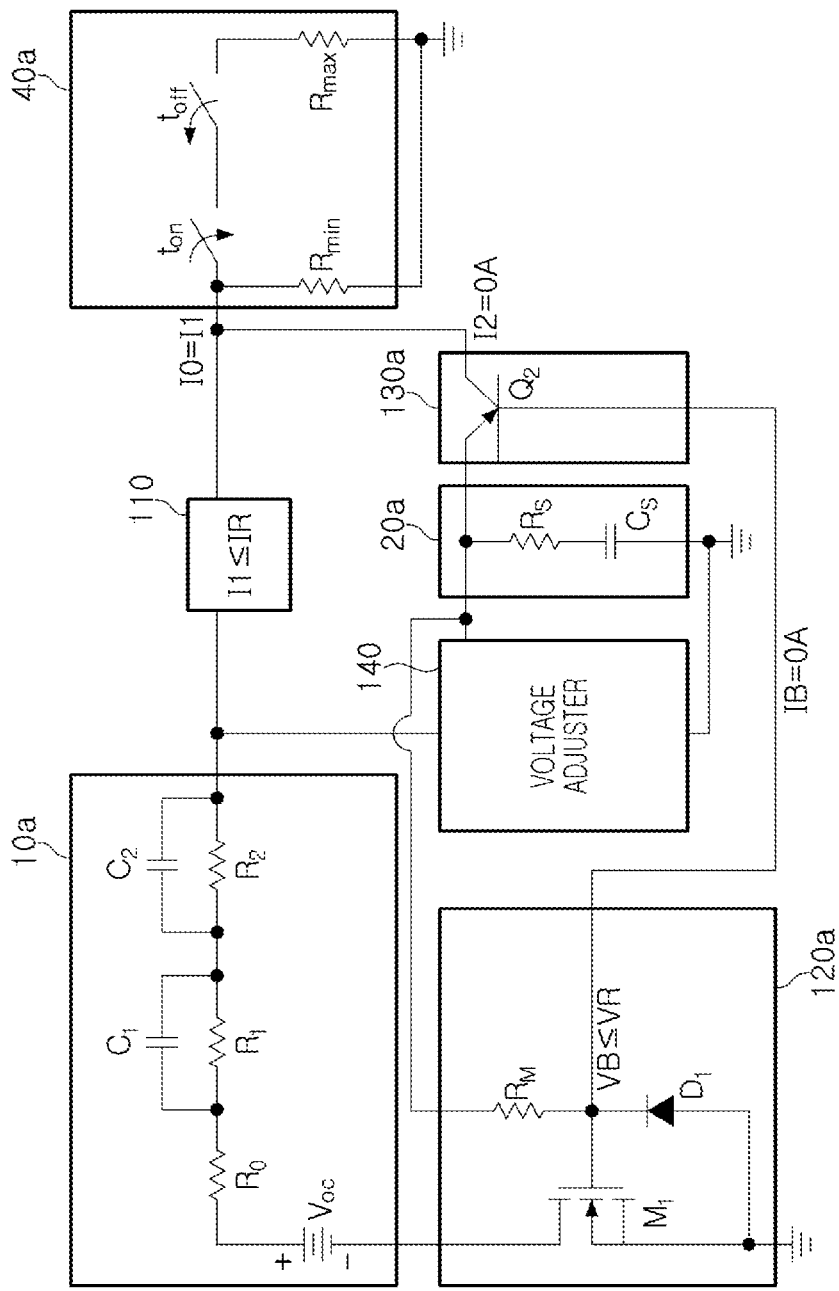
FIG. 2C is a circuit diagram illustrating the equivalent circuit of the first current limiter illustrated in FIG. 2B, when a first current is lower than or equal to a reference current.

FIG. 2C is a circuit diagram illustrating an equivalent circuit of the first current limiter illustrated in FIG. 2B, when a first current is lower than or equal to a reference current.

Referring to FIG. 2C, when an output current (IO) or a first current (I1) is lower than or equal to a reference current (IR), a voltage (VB) of the diode Dl may not reach a reference voltage (VR) and a current (IB) of a diode Dl may be close to OA.

Therefore, a second current (I2) may also be close to almost OA, and the output current (IO) and the first current (I1) may be substantially the same.

Figure 2D:
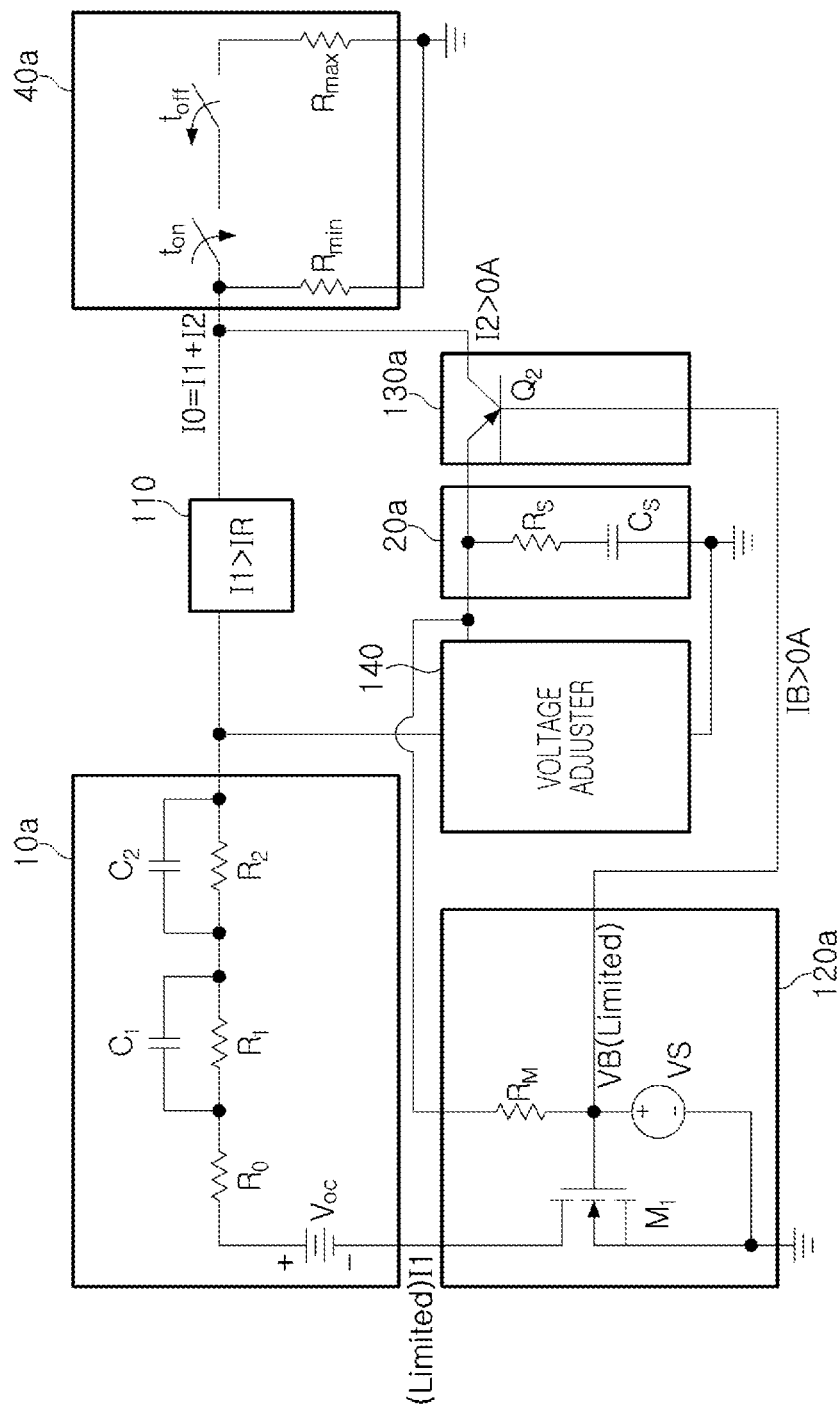
FIG. 2D is a circuit diagram illustrating the equivalent circuit of the first current limiter illustrated in FIG. 2B, when a first current exceeds a reference current.

FIG. 2D is a circuit diagram illustrating an equivalent circuit of the first current limiter illustrated in FIG. 2B, when a first current exceeds a reference current.

Referring to FIG. 2D, when an output current (IO) or a first current (I1) exceeds a reference current (IR), a diode may operate as a constant voltage source VS according to a breakdown state.

Therefore, a change in voltage (VB) of the diode may be limited, and an increase in the first current (I1) may be limited.

In addition, since a current (IB) of the diode may be changed more freely, the current (IB) of the diode may be higher than OA, and a second current (I2) may also be higher than OA. Therefore, the output current (IO) may have a magnitude corresponding to the sum of the first current (I1) which may be almost unchanged and the second flexible current (I2) which may flow.

In addition, an operation of the constant voltage source VS according to the breakdown state of the diode may also support an operation (e.g., charging/discharging of charge) of a voltage adjuster 140.

Figure 2E:
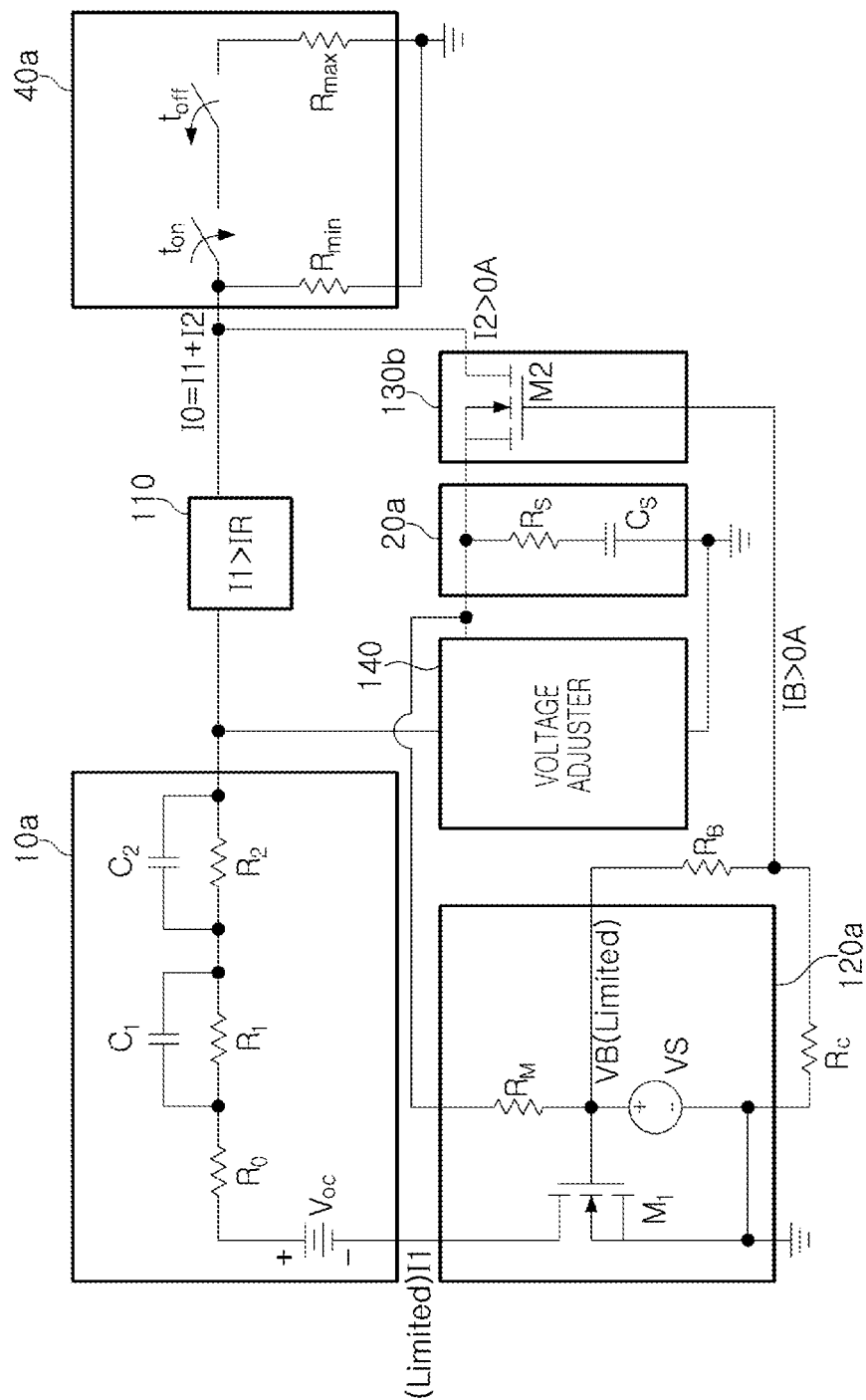
FIG. 2E is a circuit diagram illustrating a voltage based operating structure of the first current limiter and the second current activator illustrated in FIG. 2D.

FIG. 2E is a circuit diagram illustrating a voltage based operating structure of the first current limiter and the second current activator illustrated in FIG. 2D.

Referring to FIG. 2E, a second current activator 130b may be implemented with a second field effect transistor $M_2$ according to a design. Therefore, a type of transistor included in the second current active portion 130b is not particularly limited.

In this case, a gate terminal of the second field effect transistor $M_2$ may be connected to a diode gate resistor $R_B$, a ground resistor $R_C$, and the diode gate resistor $R_B$ may be connected to a ground.

Other currents in a constant voltage source VS based on a breakdown state of a diode may flow to the ground through the diode gate resistor $R_B$ and the ground resistor $R_C$, and a voltage between the diode gate resistor $R_B$ and the gate terminal may correspond to a current of the diode.

Figure 2F:
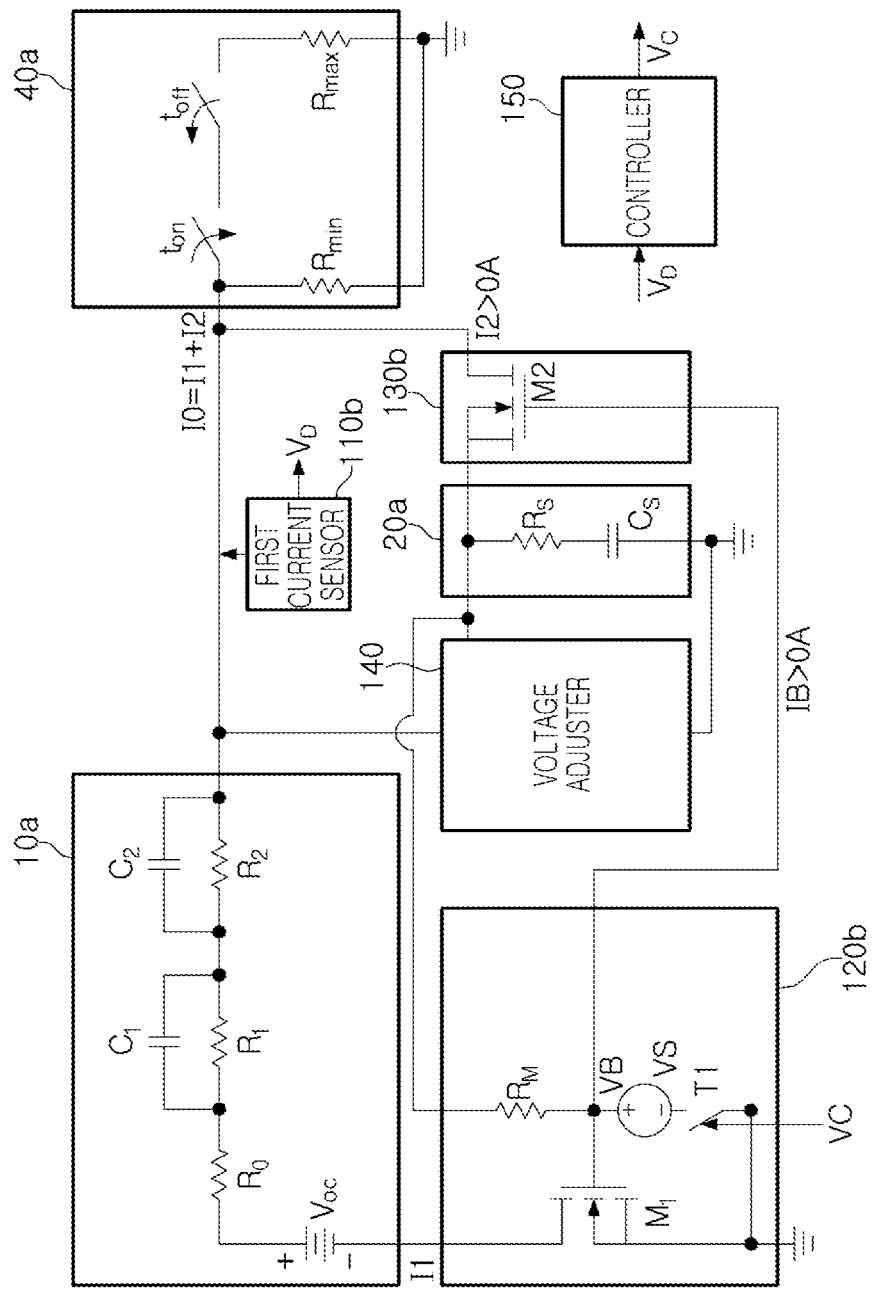
FIG. 2F is a circuit diagram illustrating an active control structure of an apparatus for controlling batteries according to an embodiment of the present disclosure.

FIG. 2F is a circuit diagram illustrating an active control structure of an apparatus for controlling batteries according to an embodiment of the present disclosure.

Referring to FIG. 2F, an apparatus for controlling batteries according to an embodiment of the present disclosure further may include a controller 150 generating a control signal $V_C$ based on a sensing result $V_D$ of a first current sensor 110b. For example, an operating principle of the first current sensor 110b is not limited to a breakdown voltage.

A first current limiter 120b may be configured to select whether to limit an increase in first current of a first battery 10a according to the control signal $V_C$.

For example, the first current limiter 120b may include a switch T1 in which an on/off state is determined according to the control signal $V_C$. In this case, the switch T1 may be configured as a transistor to determine whether to activate an electrical path between a drain terminal and a source terminal according to the control signal $V_C$ input to a gate terminal.

Figure 2G:
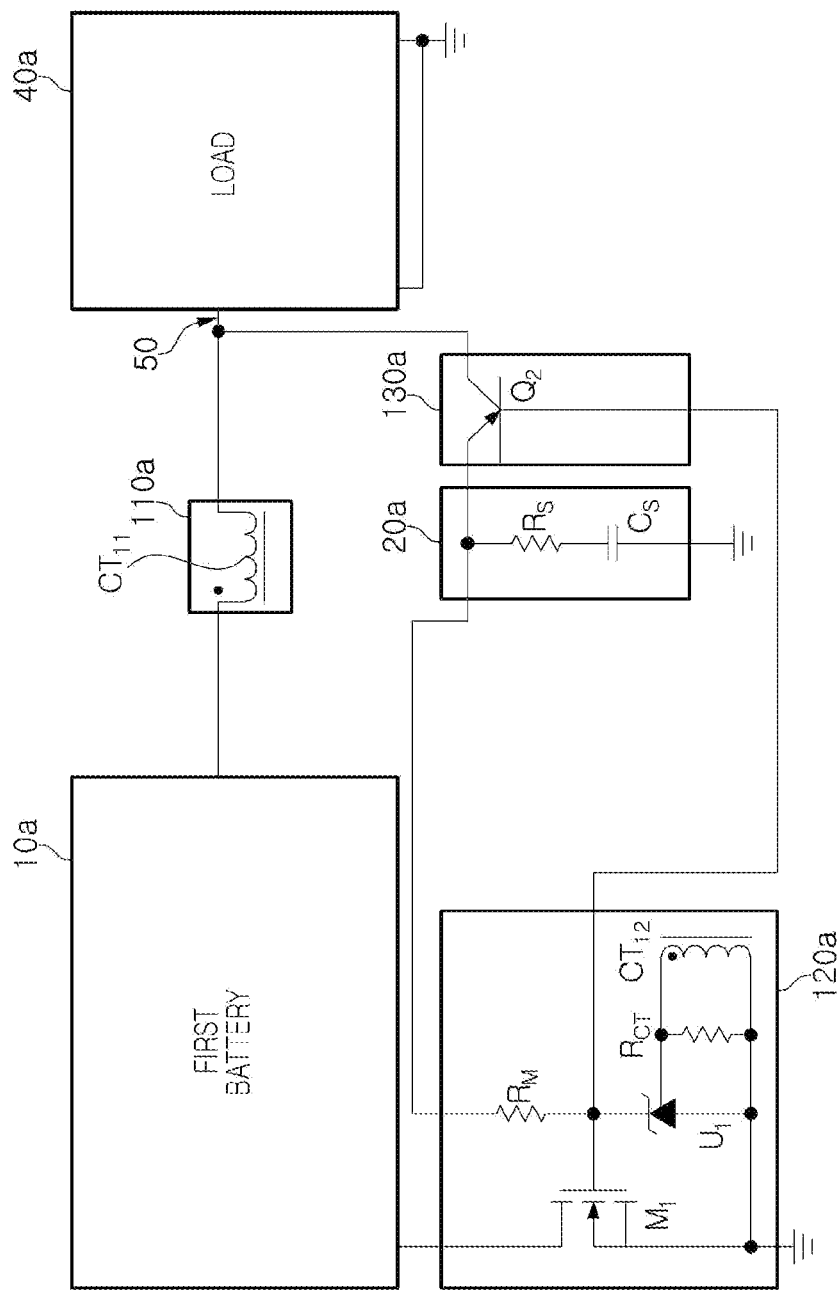
FIG. 2G is a circuit diagram illustrating a structure in which a voltage adjuster of an apparatus for controlling batteries according to an example embodiment of the present disclosure is omitted.

FIG. 2G is a circuit diagram illustrating a structure in which a voltage adjuster of an apparatus for controlling batteries according to an example embodiment of the present disclosure is omitted.

Referring to FIG. 2G, a voltage adjuster of the apparatus for controlling batteries according to an example embodiment may be omitted.

For example, when first and second voltages of first and second batteries 10a and 20a are similar to each other, the voltage adjuster may be easily omitted.

For example, when voltage stability required in a load 40a is relatively low or when the load 40a further includes an auxiliary structure that mitigates a variation in voltage, the voltage adjuster may be easily omitted.

Figure 2H:
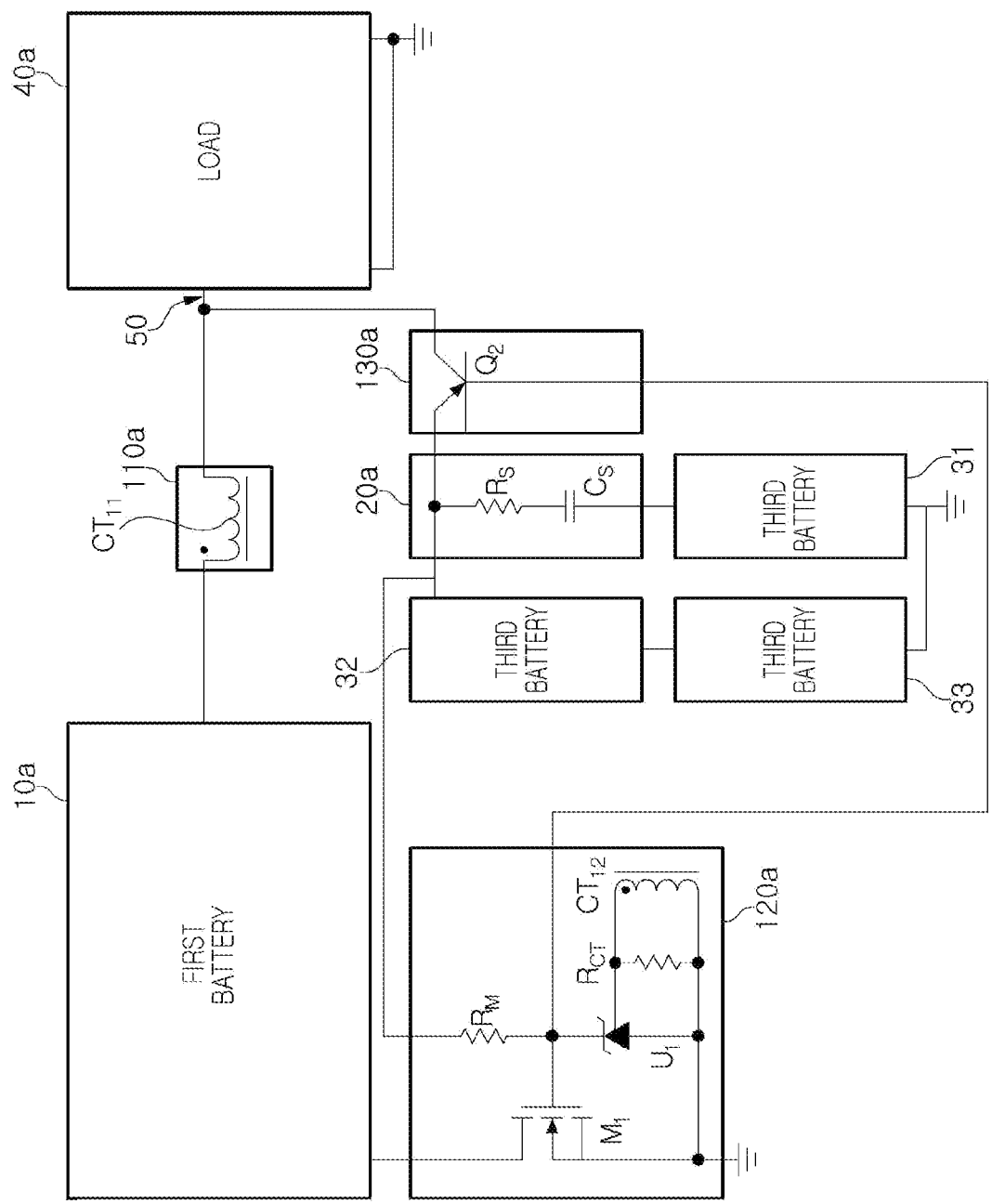
FIG. 2H is a circuit diagram illustrating the apparatus for controlling batteries illustrated in FIG. 1B.

FIG. 2H is a circuit diagram illustrating the apparatus for controlling batteries illustrated in FIG. 1B.

Referring to FIG. 2H, an apparatus for controlling batteries according to an embodiment of the present disclosure may selectively provide a load 40a with a current of third batteries 31, 32, and 33 according to whether a second current activator 130a is activated.

For example, the number of batteries in a circuit structure of the apparatus for controlling batteries according to an embodiment of the present disclosure is not particularly limited.

Figure 3:
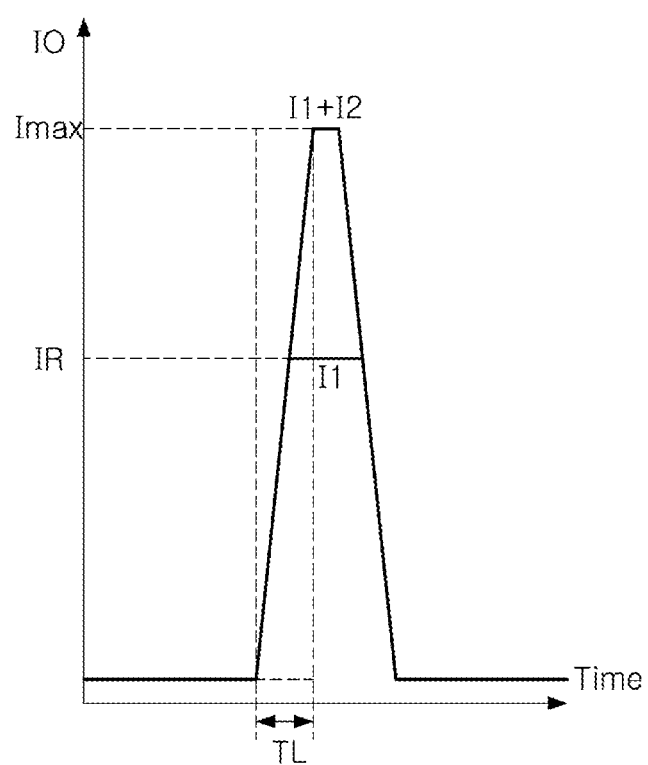
FIG. 3 is a graph illustrating changes in first and second currents of first and second batteries according to changes in current flowing to a load of an apparatus for controlling batteries according to an example embodiment of the present disclosure.

FIG. 3 is a graph illustrating changes in first and second currents of first and second batteries according to changes in current flowing to a load of an apparatus for controlling batteries according to an example embodiment of the present disclosure.

Referring to FIG. 3, when the total current (IO) supplied to a load increases to a maximum current ($I_{max}$) during increased time (TL), a first current (I1) of a first battery may increase up to a reference current (IR), and a second current (I2) of a second battery may increase from a moment in which the first current (I1) increases to the reference current (IR).

Figure 4A:
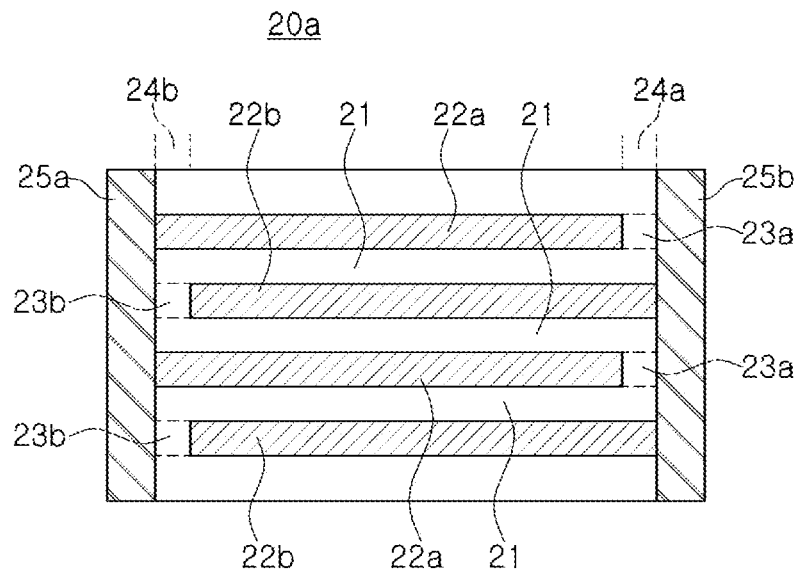
FIG. 4A is a side view illustrating a second battery that is a control target of an apparatus for controlling batteries according to an embodiment of the present disclosure.

FIG. 4A is a side view illustrating a second battery that is a control target of an apparatus for controlling batteries according to an embodiment of the present disclosure.

Referring to FIG. 4A, a second battery 20a may include a solid electrolyte 21, an internal positive electrode 22a, an internal negative electrode 22b, a positive electrode blocking portion 23a, a negative electrode blocking portion 23b, a positive electrode margin portion 24a, a negative electrode margin portion 24b, an external positive electrode 25a, and an external negative electrode 25b.

The internal positive electrode 22a may be disposed on one of upper and lower surfaces of the solid electrolyte 21. The internal negative electrode 22b may be disposed on the other/opposing of the upper and lower surfaces of the solid electrolyte 21.

For example, the internal positive electrode 22a and the internal negative electrode 22b may be alternately stacked with the solid electrolyte 21 interposed therebetween. For example, the internal negative electrode 22b and the internal positive electrode 22a may include a ceramic oxide-based material, but are not limited thereto.

For example, the solid electrolyte 21 may serve as a region in which lithium ions move between the internal positive electrode 22a and the internal negative electrode 22b, and may include a ceramic oxide-based material, but is not limited thereto.

For example, the solid electrolyte 21, the internal positive electrode 22a, and the internal negative electrode 22b may be calcined after being stacked in a slurry state or a paste state. The slurry may be stacked by a doctor blade method or the like, and the paste may be printed in a predetermined form by a screen-printing method, a gravure printing method, or the like.

The external positive electrode 25a may be connected to the internal positive electrode 22a, and may be disposed on a first side surface of the solid electrolyte 21.

The external negative electrode 25b may be connected to the internal negative electrode 22b, and may be disposed on a second side surface of the solid electrolyte 21.

For example, the external positive electrode 25a and the external negative electrode 25b may include a noble metal (e.g., Pt, Au, Ag, or the like), but are not limited thereto, may be configured to include metals such as Cu, Pd, Pb, Ni, Sn, or the like, and may include a plating layer.

External surfaces of the external positive electrode 25a and the external negative electrode 25b may contact solder paste, and may be electrically connected to a substrate such as a PCB through the solder paste. The solder paste may be hardened in a state in which an all-solid-state battery 110 is mounted on a substrate.

Figure 4B:
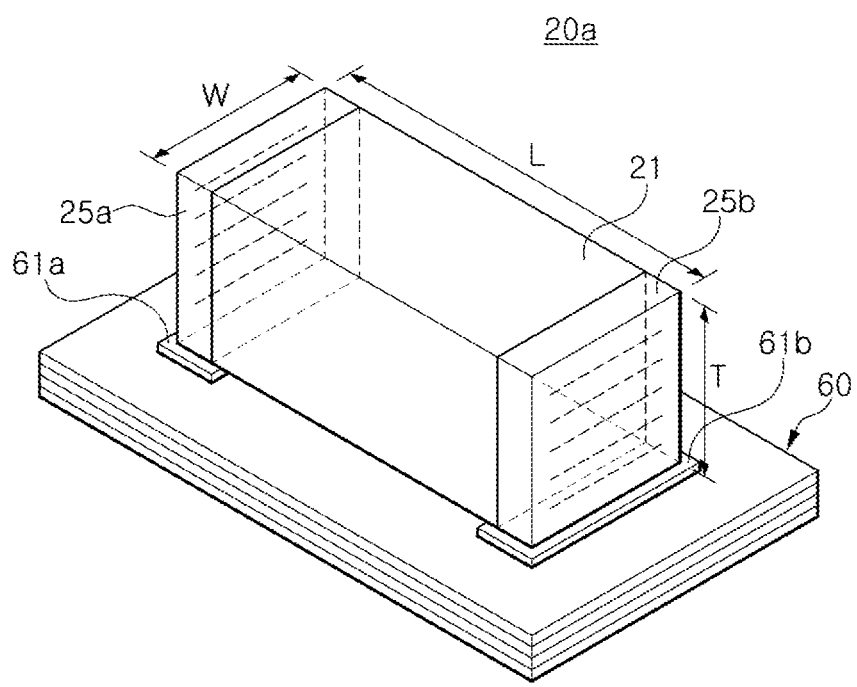
FIG. 4B is a perspective view illustrating a mounting on a substrate of the second battery illustrated in FIG. 4A.

FIG. 4B is a perspective view illustrating a mounting on a substrate of the second battery illustrated in FIG. 4A.

Referring to FIG. 4B, the external positive electrode 25a and the external negative electrode 25b of the second battery 20a may be arranged on upper surfaces of first and second electrical connection structures 61a and 61b, respectively. The first and second electrical connection structures 61a and 61b may be arranged on a substrate 60.

In this case, the external positive electrode 25a and the external negative electrode 25b may be fixed to the first and second electrical connection structures 61a and 61b, respectively, by tin or an alloy-based solder containing tin.

Figure 5:
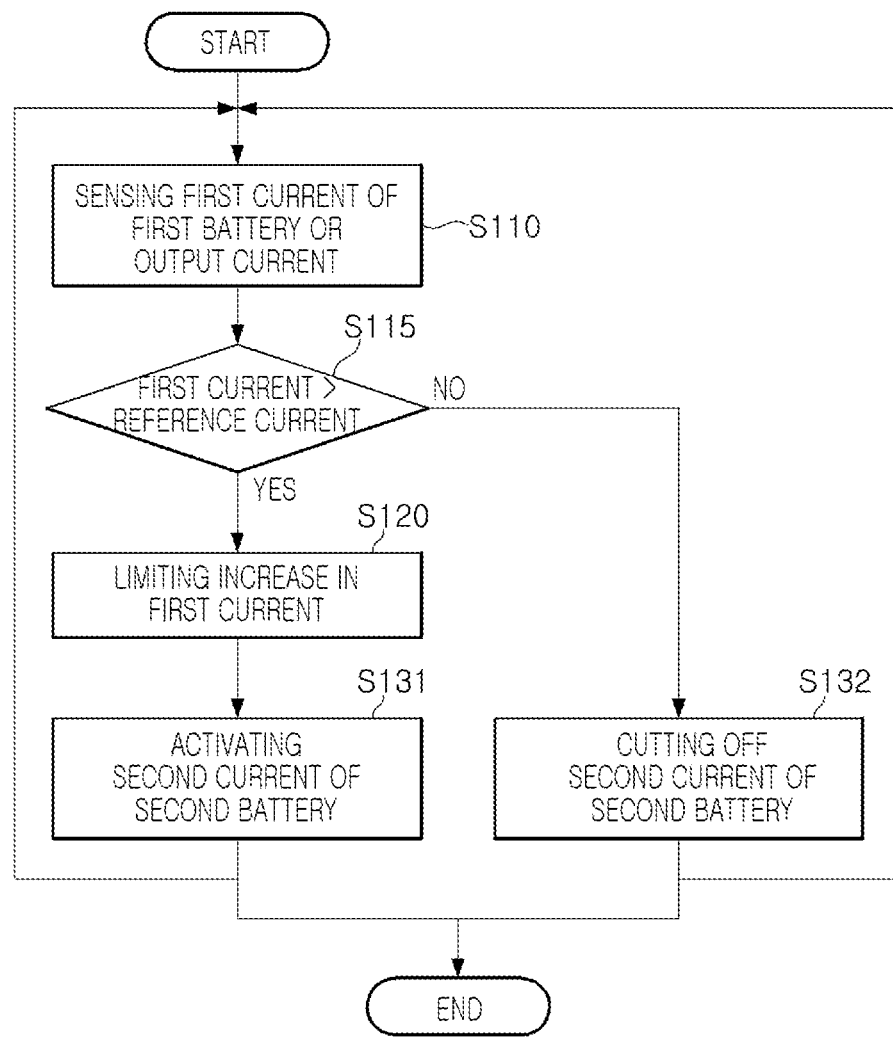
FIG. 5 is a flowchart illustrating control of an apparatus for controlling batteries and/or an electronic device according to an example embodiment of the present disclosure.

FIG. 5 is a flowchart illustrating control of an apparatus for controlling batteries and/or an electronic device according to an example embodiment of the present disclosure.

Referring to FIG. 5, an apparatus for controlling batteries and/or an electronic device according to an embodiment of the present disclosure may sense a first current of a first battery or an output current in a first operation (S110).

In a second operation (S115), the apparatus for controlling batteries and/or the electronic device may check whether the first current exceeds a reference current.

The apparatus for controlling batteries and/or the electronic device may limit an increase in first current when the first current exceeds the reference current in a third operation (S120).

The apparatus for controlling batteries and/or the electronic device may activate a second current of a second battery, when the first current exceeds the reference current, in a fourth operation (S131).

The apparatus for controlling batteries and/or the electronic device may cut off the second current of the second battery, when the first current is lower than or equal to the reference current, in a fifth operation (S132).

An electronic device according to an embodiment of the present disclosure may perform the control method illustrated in FIG. 5 through an apparatus for controlling batteries, but is not limited thereto. The electronic device may be performed by a PMIC or may be performed in a software manner by a processor.

The apparatus for controlling batteries according to an embodiment of the present disclosure may easily extend the lifespan of the battery, may reduce the size of the battery more easily according to the relaxation of the specifications (e.g., maximum current, rated capacity) required for the batteries, and may further improve the safety of the batteries (e.g., explosion potential in high temperature environments).

The electronic device including batteries according to an example embodiment of the present disclosure may improve substantial performance of a load, even without substantially shortening the lifespan of the batteries, to ensure performance of applications (e.g., communication, display, big data management, etc.), and may improve the stability and durability of the batteries to have improved stability and durability of the electronic device.

While example embodiments have been illustrated and described above, it will be apparent to those skilled in the art that modifications and variations could be made without departing from the scope of the present disclosure as defined by the appended claims.

What is claimed is:

1. An apparatus for controlling batteries, comprising:
a first current sensor configured to sense a first current flowing from a first battery to an output unit;
a first current limiter configured to use a sensing result of the first current sensor to limit an increase of the first current, when the first current exceeds a reference current; and
a second current activator configured to draw a second current of a second battery to the output unit, based on the limiting of the first current limiter.

2. The apparatus according to claim 1, wherein the first battery comprises a liquid electrolyte, and
the second battery comprises a solid electrolyte.

3. The apparatus according to claim 2, wherein the second battery further comprises,
an internal positive electrode disposed on one surface of an upper surface and a lower surface of the solid electrolyte;
an internal negative electrode disposed on another surface of the upper surface and the lower surface of the solid electrolyte;
an external positive electrode electrically connected to the internal positive electrode and disposed on a first side surface of the solid electrolyte; and
an external negative electrode electrically connected to the internal negative electrode and disposed on a second side surface of the solid electrolyte.

4. The apparatus according to claim 2, wherein the second current activator is configured to draw a third current of a third battery, electrically connected to the second battery, to the output unit, based on the limiting of the first current limiter.

5. The apparatus according to claim 1, further comprising a voltage adjuster configured to adjust a level of a second voltage of the second battery such that the level of the second voltage is closer to a level of a first voltage of the first battery.

6. The apparatus according to claim 1, wherein the first current limiter is configured to use a breakdown voltage of a diode to limit the increase of the first current.

7. The apparatus according to claim 6, wherein the first current limiter comprises a current limiting transistor configured to provide a path through which a current corresponding to the first current flows, receive an input voltage corresponding to the breakdown voltage, and limit the increase of the first current.

8. The apparatus according to claim 1, wherein the second current activator comprises a current activating transistor that provides an electrical path between the second battery and the output unit based on a base current according to a breakdown voltage of a diode.

9. The apparatus according to claim 1, wherein the first current sensor comprises a current transformer generating a sensing current based on the first current, and
the first current limiter comprises:
an impedance element providing a sensing voltage corresponding to the sensing current; and
a diode being in a breakdown state when the sensing voltage reaches a reference voltage corresponding to the reference current.

10. The apparatus according to claim 1, further comprising a controller configured to generate a control signal, based on the sensing result of the first current sensor,
wherein the first current limiter is configured to select whether to limit the increase of the first current according to the control signal.

11. An electronic device comprising:
a substrate providing an arrangement space for a load;
a first battery providing first electric power to the load and comprising a liquid electrolyte;
a second battery mounted on the substrate and comprising a solid electrolyte; and
a battery controller configured to cut off second electric power supplied from the second battery to the load when an input current of the load is equal to or lower than a reference current, and activate supply of the second electric power to the load when the input current of the load exceeds the reference current.

12. The electronic device according to claim 11, wherein the second battery further comprises:
an internal positive electrode disposed on one surface of an upper surface and a lower surface of the solid electrolyte;
an internal negative electrode disposed on another surface of the upper surface and the lower surface of the solid electrolyte;
an external positive electrode electrically connected to the internal positive electrode and disposed on a first side surface of the solid electrolyte; and
an external negative electrode electrically connected to the internal negative electrode and disposed on a second side surface of the solid electrolyte,
wherein the substrate comprises:
a first electrical connection structure having an upper surface on which the external positive electrode is disposed; and
a second electrical connection structure having an upper surface on which the external negative electrode is disposed.

13. The electronic device according to claim 11, wherein the battery controller comprises:
a first positive electrode connecting portion to which a positive electrode of the first battery is electrically connected;
a first negative electrode connecting portion to which a negative electrode of the first battery is electrically connected;
a second positive electrode connecting portion to which a positive electrode of the second battery is electrically connected; and
a second negative electrode connecting portion to which a negative electrode of the second battery is electrically connected.

14. The electronic device according to claim 11, wherein the battery controller comprises:

a second positive electrode connecting portion to which a positive electrode of the second battery is electrically connected through a positive wiring of the substrate; and
a second negative electrode connecting portion to which a negative electrode of the second battery is electrically connected through a negative wiring of the substrate.

15. The electronic device according to claim 11, wherein the battery controller comprises a Zener diode.

16. The electronic device according to claim 11, wherein the battery controller comprises a bipolar junction transistor and a field effect transistor.

17. A power controller comprising:
a sensor configured to sense a first electric power supplied from a first power source to a load;
an output limiter configured to limit increase of the first electric power supplied from the first source based on the first electric power supplied from the first source exceeding a reference threshold; and
a switch configured to allow flow of a second electric power supplied from a second power source to the load based on the output limiter limiting the increase of the first electric power supplied from the first power source.

18. The power controller of claim 17, wherein the first power source comprises a liquid electrolyte, and
the second power source comprises a solid electrolyte.

19. The power controller of claim 17, wherein the second power source includes:
a body;
a plurality of first internal electrodes and a plurality of second internal electrodes that are alternately stacked to overlap with each other and be spaced apart from each other in the body; and
first and second external electrodes disposed on one or more external surfaces of the body and respectively connected to the plurality of first internal electrodes and the plurality of second internal electrodes.

20. The power controller of claim 19, wherein the first and second internal electrodes are alternately stacked with solid electrolyte layers disposed therebetween so as to be spaced apart from each other by the solid electrolyte layers.

21. The power controller of claim 17, further comprising:
a voltage adjuster comprising a boost DC-DC converter circuit or a charge pump circuit, and configured to adjust a voltage level at an output of the second power source to match a voltage level at an output of the first power source.

22. The power controller of claim 17, wherein the sensor and output limiter are disposed in series with the first power source between a ground terminal and the load, and
the switch is disposed in series with the second power source between the ground terminal and the load.

23. A power controller for controlling flow of power from a first power source to an output unit, the power controller comprising:
a first current limiter configured to be disposed in series with the first power source between a ground terminal and the output unit, and configured to regulate power flow from the first power source to the output unit;
a second power source and a second current activator disposed in series with each other between the ground terminal and the output unit,
wherein the second current activator regulates power flow from the second power source to the output unit under control of the first current limiter.

24. The power controller of claim 23, wherein the second power source provides operating power to the first current limiter.

25. The power controller of claim 23, wherein the second power source is a solid electrolyte battery.

26. The power controller of claim 23, wherein the second power source includes:
   a body;
   a plurality of first internal electrodes and a plurality of second internal electrodes that are alternately stacked to overlap with each other and be spaced apart from each other in the body; and
   first and second external electrodes disposed on one or more external surfaces of the body and respectively connected to the plurality of first internal electrodes and the plurality of second internal electrodes.

27. The power controller of claim 26, wherein the first and second internal electrodes are alternately stacked with solid electrolyte layers disposed therebetween so as to be spaced apart from each other by the solid electrolyte layers.

* * * * *